United States Patent [19]

Galani et al.

[11] Patent Number: 5,032,800
[45] Date of Patent: Jul. 16, 1991

[54] TUNABLE OSCILLATOR WITH NOISE DEGENERATION

[75] Inventors: Zvi Galani, Bedford; Michael J. Bianchini, N. Middleboro; Raymond C. Waterman, Jr., Westford, all of Mass.

[73] Assignee: Raytheon Company, Lexington, Mass.

[21] Appl. No.: 538,439

[22] Filed: Jun. 15, 1990

[51] Int. Cl.$^5$ .............................................. H03B 5/18
[52] U.S. Cl. ..................... 331/1 R; 331/96; 331/117 D
[58] Field of Search ...................... 331/1 R, 96, 117 D

[56] References Cited

U.S. PATENT DOCUMENTS

| 4,555,678 | 11/1985 | Galani et al. | 331/1 A |
| 4,692,714 | 9/1987 | Galani | 331/1 R |
| 4,758,800 | 7/1988 | DiBiase et al. | 331/1 R |

OTHER PUBLICATIONS

Osamu Ishihara et al., "A Highly Stabilized GaAs FET Oscillator Using a Dielectric Resonator Feedback Circuit in 9–14 GHz", IEEE Transactions on Microwave Theory and Techniques, vol. MTT-28, No. 8, Aug. 1980, pp. 817–824.

Primary Examiner—Siegfried H. Grimm
Attorney, Agent, or Firm—Donald F. Mofford; Richard M. Sharkansky

[57] ABSTRACT

An oscillator providing predictable oscillator modulation sensitivity includes an amplifier and a feedback circuit disposed about the amplifier. The feedback circuit includes a resonator having a first port and a second port and a voltage-controlled phase shifter having an input port, an output port and a control port, the input port of the voltage-controlled phase shifter connected to the output port of the amplifier and the output port of the voltage-controlled phase shifter coupled to a port of the resonator. The oscillator further includes a circuit, responsive to signals from the output of the voltage-controlled phase shifter and the first port of the resonator, to provide a control signal to the control port of the voltage-controlled phase shifter for degenerating low frequency FM noise arising within the amplifier.

5 Claims, 2 Drawing Sheets

TUNABLE OSCILLATOR WITH NOISE DEGENERATION

BACKGROUND OF THE INVENTION

This invention relates generally to microwave oscillators and in particular to low-noise microwave oscillator circuits.

It is well known that many advanced electronic systems for communication and navigation require circuits, including oscillator circuits, having low noise for low noise applications. Such low noise applications include space communications, electronic warfare counter measures and modern radar techniques. In a microwave oscillator, frequency modulation (FM) noise is a problem due to the noise characteristics of the components in the oscillator. In many applications, it is advantageous to reduce the FM noise characteristics of the oscillator. One technique known for lowering the FM noise of a single resonator feedback oscillator including an amplifier with a gallium arsenide field effect transistor (FET) as an element is providing a high Q element in the feedback circuit as described in an article by O. Ishihara, T. Mori, H. Sawano and M. Nakatani entitled "A Highly Stabilized GaAs FET Oscillator Using a Dielectric Resonator Feedback Circuit in 9-14 GH$_z$" IEEE Transactions on Microwave Theory and Techniques, vol. MTT-28, No. 8, Aug. 1980, pp. 817-824. However, the FM noise, although reduced, is still relatively high.

A second technique known for reducing noise is using a gallium arsenide FET as an active element in a single resonator (tunable or fixed-frequency) microwave oscillator as described in U.S. Pat. No. 4,555,678, issued Nov. 26, 1985, entitled "Microwave Oscillator" (which patent is assigned to the same assignee as this application). In said patent, it is described that a gate bias port of a FET amplifier can be used as the tuning port of the oscillator, since the gate-to-source capacitance of the FET is dependent on gate-to-source voltage. Thus, a signal applied between the gate and source terminals changes the value of the gate-to-source capacitance which, in turn, modulates the phase of the signal amplified by the FET. The dispersive phase response of the resonator in the feedback circuit converts the phase modulation of the amplified signal to a frequency modulated signal at the output of the oscillator. Thus, the frequency of the oscillator is modulated by the signal applied to the gate bias port serving as the tuning port of the oscillator.

Although it is useful in many applications, using the gate bias port of the FET amplifier as the tuning port of the oscillator has some disadvantages. For example, the gate-to-source capacitance versus voltage relationship is difficult to accurately predict because the relationship is a function of the large signal conditions under which the oscillator reaches steady state and the phase shift versus gate voltage characteristic of the amplifier is not necessarily monotonic. The relationship also changes from one FET to another because of variability in FET parameters from one FET to another so that it is very difficult to predict accurately the modulation sensitivity of the oscillator. Since modulation sensitivity is a critical frequency lock loop design parameter, the modulation sensitivity of every oscillator has to be measured individually and the parameters of each corresponding frequency lock loop have to be adjusted accordingly to obtain the desired performance of the frequency lock loop. Furthermore, this method of oscillator frequency tuning is not particularly well suited for the use of one-port devices (e.g., Gunn or IMPATT diodes) as the active element in the oscillator circuit. Finally, when the oscillator power supplies are first turned on, the frequency lock loop output voltage fed to the gate bias port may be excessive such that the effective gate DC bias voltage is positive causing large gate current conduction which can destroy the transistor.

SUMMARY OF THE INVENTION

In accordance with the present invention, an oscillator includes an amplifier having an input and an output, and a feedback circuit disposed between the input and the output of the amplifier. The feedback circuit includes a resonator and a voltage-controlled phase shifter disposed in series with the resonator. The oscillator further includes means, responsive to signals from the voltage controlled phase shifter and the resonator, for providing a control signal to a control port of the voltage-controlled phase shifter for degenerating low frequency noise within the amplifier. With this particular arrangement, using a control port of the voltage-controlled phase shifter as the tuning port of the oscillator provides an oscillator having predictable oscillator modulation sensitivity from oscillator to oscillator and a modulation sensitivity which is independent of the signal level in the oscillator feedback loop until very high signal levels are reached. Additionally, a frequency tuning capability is provided for oscillators using one-port amplifier devices such as Gunn diode amplifiers and IMPATT diode amplifiers.

In accordance with a further aspect of the present invention, an oscillator includes an amplifier having an input and an output with a field effect transistor as an active element and a resonator having a first port and a second port, used in a transmission mode as a parallel feedback element in a feedback circuit disposed between the input and the output of the amplifier. The oscillator further includes a voltage-controlled phase shifter having a control port (responsive to a control signal) for controlling the phase shift of signals fed thereto, and disposed in the feedback loop in series with the resonator. The oscillator further includes means for dividing signals from the feedback loop into at least a first path and a second path and a circulator having a first port, a second port and a third port, the first port of the circulator fed by signals in the first path and the second port of the circulator connected to the first port of the resonator. The oscillator further includes a phase detector having a first and a second input port and an output port disposed so that the first input port is fed by signals from the third port of the circulator. A 90° phase shifter having an input port and an output port is disposed so that the input port of the 90° phase shifter is fed by the signals from the second path of the dividing means and the output port of the 90° phase shifter is connected to the second input port of the phase detector. The oscillator also includes means, responsive to the output port of the phase detector, for providing the control signal to the voltage-controlled phase shifter. With this particular arrangement, the modulation sensitivity from oscillator to oscillator is independent of the signal level in the oscillator feedback loop unless very high signal levels are reached and the oscillator has better FM noise performance than an oscillator having only a resonator with a high Q in the feedback loop.

BRIEF DESCRIPTION OF THE DRAWINGS

For a more complete understanding of this invention, reference is now made to the following description of the accompanying drawings, wherein.

DESCRIPTION OF THE PREFERRED EMBODIMENT

Figure 1:
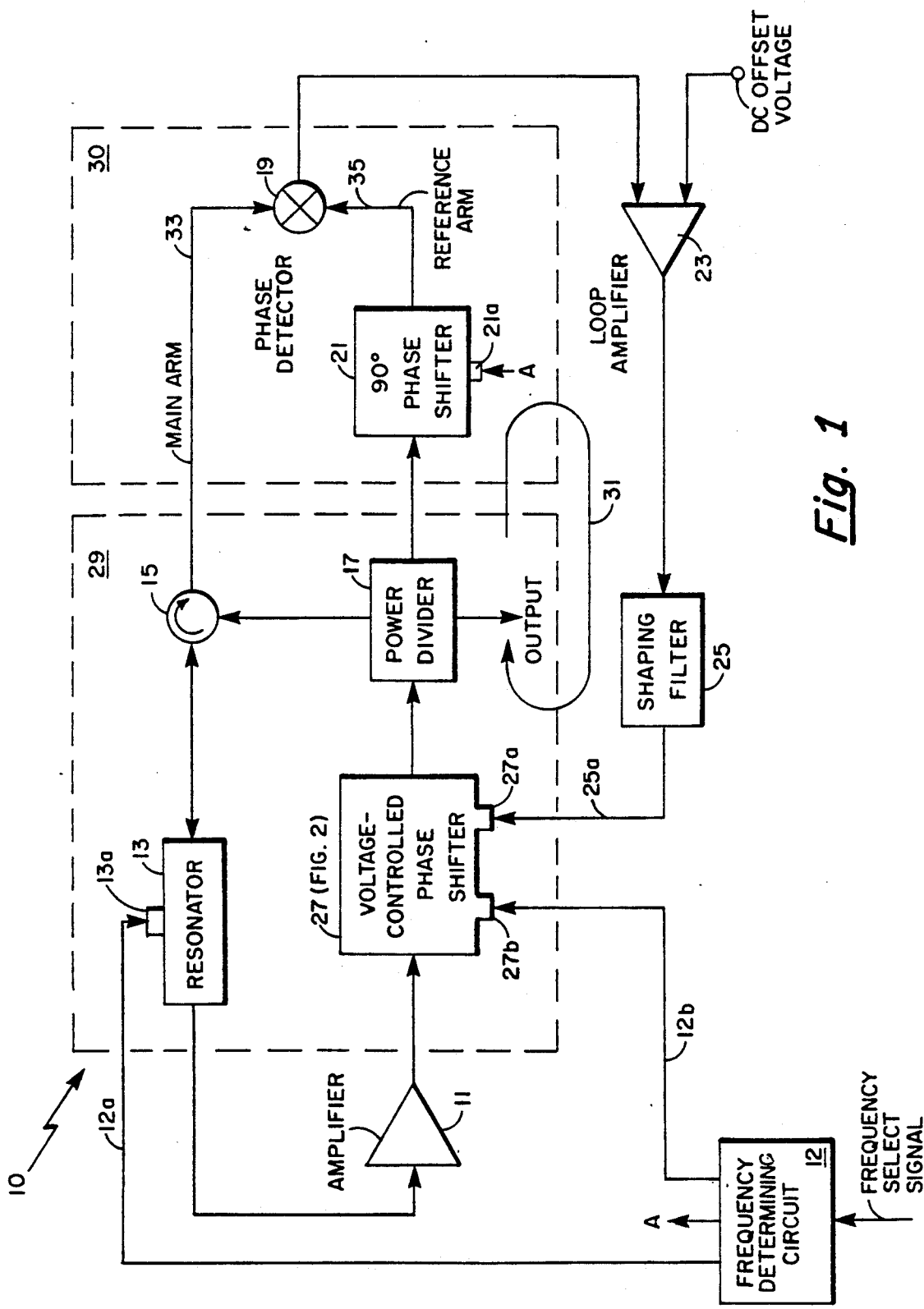
FIG. 1 is a block diagram of a low noise oscillator according to this invention.

Referring now to FIG. 1, an oscillator 10 is shown to include an amplifier 11, having an input and an output and a feedback circuit 29 disposed about the amplifier 11. The amplifier 11 preferably includes a GaAs MESFET or other type of field effect or bipolar transistor as the active element thereof, but could also be of another type of amplifier including a Gunn diode amplifier or an IMPATT diode amplifier. The feedback circuit 29 includes a resonator 13 having a first port, a second port coupled to the input of the amplifier 11, and a control port 13a. The resonator 13 has a resonant frequency determined by a control signal fed to the control port 13a. The feedback circuit 29 further includes a voltage-controlled phase shifter 27 having an input port coupled to the output of the amplifier 11 and an output port coupled to an input port of power divider 17. The voltage controlled phase shifter 27 also includes a control port 27a fed by a control signal along line 25a which adjusts the phase of a signal propagating through feedback circuit 29 in a manner as will be described and coarse control port 27b fed by a coarse control signal along line 12b in a manner as will also be described. The power divider 17 has a first output port coupled to a first port of circulator 15 and a third output port which is used to provide the output from the oscillator 10. The circulator 15 also has a second port and a third port, wherein the second port of circulator 15 is coupled to the first port of resonator 13. The third port of the circulator 15 and a second port of the power divider 17 are used to feed signals to a discriminator circuit 30 that provides the control signal to the voltage-controlled phase shifter 27 as will be described.

Resonator 13 can be any type of resonator, resonant at a frequency, $f_o$, but in the preferred embodiment it is a magnetically tuned resonant circuit such as a yttrium-iron-garnet (YIG) tuned bandpass filter. Since the oscillator 10 is here optimized for a frequency in X-band, a YIG tuned bandpass filter is used as the resonator 13 to stabilize the phase and frequency characteristics of the oscillator 10. A YIG tuned bandpass filter could be used such as that described in accordance with the teachings of U.S. Pat. No. 4,758,800, issued July 19, 1988, entitled "Low Noise Magnetically Tuned Resonant Circuit" (which patent is assigned to the same assignee as this application). For a signal propagating through feedback circuit 29, the resonator 13 operates in a transmission mode. Resonator 13 has a high Q to reduce FM noise and provide a positive feedback signal in feedback circuit 29. A signal from the second port of the resonator 13 is fed to the input port of the amplifier 11 wherein such signals are amplified. The signal at the output port of the amplifier 11 is fed to the input port of the voltage-controlled phase shifter 27. The voltage-controlled phase shifter 27 is capable of coupling the signal from the input port to the output port of the voltage-controlled phase shifter 27 while imparting a selectable differentiated phase shift to said signal (as described in more detail hereinafter), the amount of which is selected by the control signals applied to the control ports 27a, 27b of the voltage-controlled phase shifter 27. The conditions for commencement of oscillation of oscillator 10 at frequency, $f_o$, are satisfied if the gain of the amplifier 11 exceeds the total loss of the feedback circuit 29 and the total phase shift through the feedback circuit 29 and the amplifier 11 is an integral multiple of $2\pi$ radians at the frequency, $f_o$.

The oscillator 10 further includes the discriminator circuit 30 which is fed by a pair of signals with one of said signals from the third port of the circulator 15 being fed along a branch referred to in FIG. 1 as the "Main Arm" directly to an input of a phase detector 19. The second signal is fed to a 90° phase shifter 21 and along a branch referred to as the "Reference Arm" to a second input of the phase detector 19. The output of the phase detector 19 is fed to a loop amplifier 23 and a shaping filter 25, here a low-pass filter, to provide the control signal along line 25a.

In operation, the signal applied to the first port of resonator 13 from circulator 15 is critically-coupled. Critical coupling provides a transfer function of the discriminator 30 in the form of a conventional S-shaped discriminator curve. When the resonant frequency, $f_o$, of resonator 13 is changed, the crossover point of the S-curve changes concurrently. The slope of such discriminator curve is controlled by the degree of coupling at the first port of resonator 13 and, with critical-coupling, is directly proportional to the loaded Q of resonator 13. Critical coupling may be accomplished with a YIG type resonator 13 by adjusting the input coupling loop (not shown) of the resonator 13 to provide a reflection null at $f_o$ from the first port of resonator 13.

A signal reflected from the resonator 13 is fed via the circulator 15 and the main arm 33 to the first input port of the phase detector 19. A signal travelling from the second output port of power divider 17 is applied, via the 90° phase shifter 21 and the reference arm 35, to the second input port of phase detector 19 providing a reference signal for the phase detector 19. The 90° phase shifter 21 provides a quadrature phase relationship between the reference signal and the signal reflected from the resonator 13 at the first and second input ports of the phase detector. The 90° phase shifter 21 can be a fixed or a voltage-controlled phase shifter. If 90° phase shifter 21 is a voltage-controlled phase shifter with a control port 21a, the control port is tuned in unison with the resonator 13 to maintain a quadrature relationship between the signals at the input ports of the phase detector 19. When tuning resonator 13, the path delays in the "Main Arm" and the "Reference Arm" change relative to each other if not perfectly time delay balanced. In this case, the voltage-controlled phase shifter may be used for phase shifter 21 to eliminate the delay difference and to maintain a 90° phase difference between the signals at the input ports of phase detector 19. An output signal from phase detector 19 provides a signal relative to the amount of FM noise in the oscillator 10. The signal from the output of the discriminator 30 is applied to the loop amplifier 23 where such signal is amplified. The signal from the loop amplifier 23 is fed to the shaping filter 25 where such signal is filtered and fed to the control port of the voltage-controlled phase shifter 27. A D.C. offset voltage may be summed into the second input port of the loop amplifier 23 in order to satisfy the biasing requirement of the voltage-controlled phase shifter 27.

A noise degeneration loop 31 comprising the power divider 17, the discriminator 30, the loop amplifier 23, the shaping filter 25, and the voltage-controlled phase shifter 27 is provided to degenerate FM noise in the oscillator 10 to the level of the discriminator's noise floor, which is typically set by the noise of the diodes (not shown) in the phase detector 19. An output signal from the oscillator 10 is obtained via the third output port of the power divider 17.

It will be appreciated that the noise degeneration loop 31 is also a frequency-lock loop (FLL) which causes the frequency of the signal out of the voltage-controlled phase shifter 27 to be nominally locked to the center frequency, $f_o$, of the passband of the resonator 13, when the phase shifter 27 is properly biased by the control signal fed to the control port of the voltage-controlled phase shifter 27 as a feedback signal. An undesired change of frequency in the feedback circuit 29 will result in a change in the output signal from the discriminator 30. The latter will result in a change in the control signal fed to the control port of the voltage-controlled phase shifter 27, thus minimizing changes in the frequency, $f_o$, of the oscillator.

The oscillator 10 may also include a frequency determining circuit 12, which in response to a frequency select signal from a controller (not shown), provides a control signal along line 12a to the resonator 13 at control port 13a. The control signal at the control port 13a is used to determine the center frequency, $f_o$, of the resonator 13, correlating to the frequency select signal fed the frequency determining circuit 12. It should be appreciated, when the frequency of the feedback circuit 29 is changed by changing the center frequency of resonator 13, the frequency of the crossover of the S-curve changes and the oscillator 10 is locked to the new frequency by noise degeneration loop 31. When a voltage-controlled phase shifter is used for the 90° phase shifter 21, frequency determining circuit 12 also provides a control signal to control port 21a of 90° phase shifter 21. The latter ensures that a 90° phase difference between the input signals at the input ports of phase detector 19 is maintained as the frequency, $f_o$, is changed.

The frequency determining circuit 12 further provides a control signal along line 12b to the voltage-controlled phase shifter 27 at coarse control port 27b. Such a control signal is used to bias the coarse control port 27b of the voltage-controlled phase shifter to provide a proper phase shift to ensure oscillation at the frequency, $f_o$, correlating to the frequency select signal fed the frequency determining circuit 12.

Figure 2:
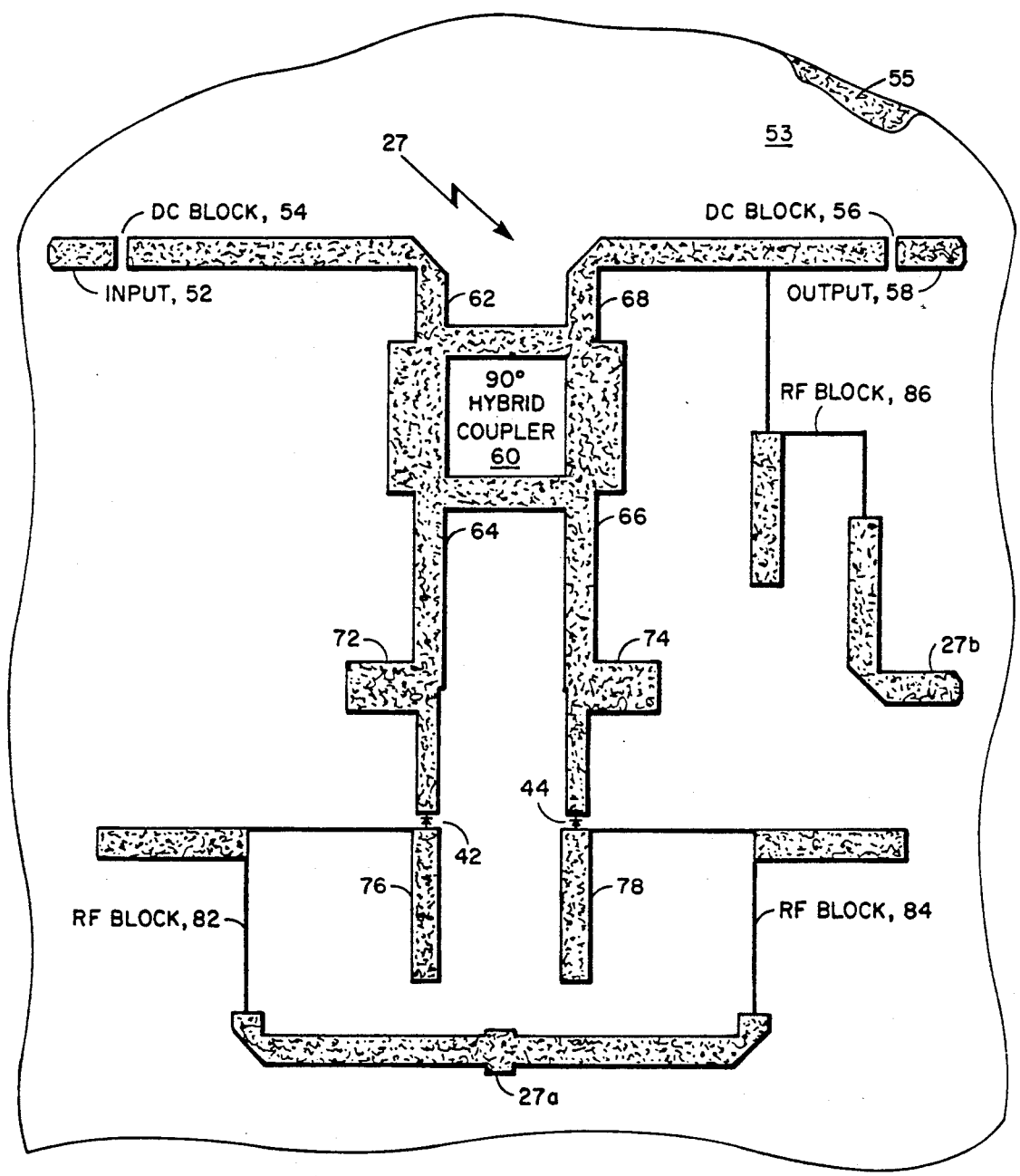
FIG. 2 is a plan view of a voltage-controlled phase shifter suitable for use in the oscillator shown in FIG. 1.

Referring now to FIG. 2, a microstrip circuit implementation (meaning microstrip circuitry disposed on a slab 53 of dielectric material (here alumina), said slab 53 disposed on a sheet 55 of conducting material) of the voltage-controlled phase shifter 27 (hereinafter also referred to as phase shifter 27) used in the microwave oscillator 10 (FIG. 1) and here optimized for operation at 9.6 GHz is shown. Preferably, the phase shifter 27 is a continuously-variable type but may consist of two or more stages, one of which may be digitally-variable. The phase shifter 27 here includes varactor diodes 42, 44 which in response to changes in a D.C. bias voltage vary in capacitance to provide changes in the phase shift imparted to RF signals fed to the phase shifter 27.

An R.F. signal from the amplifier 11 (FIG. 1) is fed to the input port 52 of the phase shifter 27 and through a D.C. block 54 (here a 20 pF capacitor). A 90° hybrid coupler 60 having a first port 62, a second port 64, a third port 66 and a fourth port 68 is fed by the R.F. signal from the D.C. block 54 at the first port 62. The R.F. signal applied to the first port 62 of the 90° hybrid coupler 60 is divided substantially equally by the 90° hybrid coupler 60 into a first portion of R.F. signal at the second port 64 and a second portion of R.F. signal at the third port 66. The first portion of the R.F. signal leaving the 90° hybrid coupler 60 passes through a R.F. tuning stub 72 and to varactor diode 42. The tuning stub 72 is provided to increase the range of the phase shift imparted to the R.F. signal while keeping the insertion loss approximately constant over the range of the voltage fed to the diode 42. A quarter wave open stub 76 provides a back short to the first portion of the R.F. signal causing the first portion of R.F. energy to be reflected back toward the 90° hybrid coupler 60. A D.C. bias signal having a suitable high reverse bias voltage is applied at terminals 27a, 27b to provide biasing for varactor diodes 42, 44. R.F. blocks 82, 84 and 86 are provided to prevent the R.F. signal from travelling back toward terminals 27a, 27b. The reverse bias voltage should be such to allow a control signal applied to either control port 27a or 27b to change the control voltage of the varactor diodes 42, 44 without forward-biasing the varactor diodes 42, 44.

The second portion of R.F. signal from the 90° hybrid coupler 60 passes through a second R.F. tuning stub 74 and to varactor diode 44. Tuning stub 74 like R.F. tuning stub 72, is provided to increase the range of the phase shifter while keeping the insertion loss approximately constant over the tuning voltage range. A quarter wave stub 78 provides a back short to the second portion of the R.F. signal causing said second portion to be reflected back toward the 90° hybrid coupler. The first portion of the R.F. signal reflected toward the 90° hybrid coupler 60 enters port 64 and the second portion of the R.F. signal reflected toward the 90° hybrid coupler 60 enters port 66. The first portion and the second portion of R.F. energy is combined by the 90° hybrid coupler 60 at port 68 of the 90° hybrid coupler 60. The R.F. signal from port 68 is passed through a D.C. block 56 (here a 20 pF capacitor) and appears at the output port 58 of the phase shifter 27. Such R.F. signal from the voltage-controlled phase shifter 27 is fed to the power divider 17 (FIG. 1).

A coarse control signal from frequency determining circuit 12 (FIG. 1) is applied to coarse control port 27b to change the D.C. bias signal to select the phase shift desired to commence oscillation in feedback circuit 29 (FIG. 1) at a frequency as selected by the frequency select signal (FIG. 1). The control signal applied to the control port 27a changes the voltage across varactor diodes 42, 44 which in response changes the capacitance of the varactor diode. The latter changes the phase shift imparted to the propagating R.F. signal portions in response to undesired frequency changes detected by noise degeneration loop 31. It should now be apparent the control signals applied to the control ports 27a and 27b control the amount of phase shift imparted to the R.F. signal entering the phase shifter 27 as the R.F. signals propagate through the phase shifter 27.

Referring back to FIG. 1, it should now be apparent such an arrangement reduces the variation of modulation sensitivity from one oscillator to another. Additionally, with such an arrangement a one-port device amplifier such as a Gunn diode amplifier or an IMPATT diode amplifier could alternatively be used as amplifier 11 since frequency variations in the oscillator 10 are controlled by the voltage-controlled phase shifter 27.

Also, by using the voltage-controlled phase shifter 27 in both the feedback loop 29 and the noise degeneration loop 31, the oscillator 10 can be tuned over a wide band of frequencies. It should also be apparent, that the elements of the above-described embodiment could be rearranged without affecting the invention. For example, the voltage-controlled phase shifter 27 could be connected between the resonator 13 and the amplifier 11, instead of between the amplifier 11 and the power divider 17.

Having described a preferred embodiment of the invention, it will now become apparent to one of skill in the art that other embodiments incorporating its concepts may be used. It is felt, therefore, that these embodiments should not be limited to disclosed embodiment but rather should be limited only by the spirit and scope of the appending claims.

What is claimed is:

1. An oscillator comprising:
   (a) first means for providing an output signal having an output frequency, said providing means comprising:
      (i) an amplifier having an input and an output;
      (ii) a feedback circuit disposed between the input and the output of the amplifier comprising:
         (a) a resonator having a control port; and
         (b) a voltage-controlled phase shifter disposed in series with the resonator;
      (iii) means for dividing signals from the feedback circuit into at least a first path and a second path; and
      (iv) a circular having a first, a second and a third port, the first port responsive to signals in the first path, the second port coupled to the resonator; and
   (b) second means, responsive to signals from the feedback circuit, for providing a control signal to the voltage-controlled phase shifter for degenerating low frequency noise within the oscillator, the second providing means comprising:
      (i) a 90° voltage-controlled phase shifter, responsive to the signals from the second path of the dividing means;
      (ii) a phase detector having a first and a second input port and an output port, the first input port responsive to signals from the third port of the circulator, and the second input port responsive to signals from the 90° voltage-controlled phase shifter;
      (iii) means, coupled to the output port of the phase detector, for generating a control signal applied to a control port of the voltage-controlled phase shifter; and
   (c) means for:
      (i) providing a resonator control signal fed to the control port of the resonator for tuning the resonator at the output frequency;
      (ii) providing a 90° voltage-controlled phase shifter control signal for tuning the 90 ° voltage-controlled phase shifter; and
      (iii) providing a voltage-controlled phase shifter coarse control signal for tuning the voltage-controlled phase shifter to produce a selected differentiated phase shift corresponding to the output frequency.

2. An oscillator as recited in claim 1 wherein the control signal generating means comprises:
   (a) a loop amplifier responsive to signals from the output port of the phase detector; and
   (b) a shaping filter having an input and an output, the input of the shaping filter responsive to signals from the loop amplifier and the output of the shaping filter coupled to the control port of the voltage-controlled phase shifter.

3. An oscillator as recited in claim 1 wherein the dividing means further comprises means for dividing signals from the feedback circuit into a third path, said third path being an output for the oscillator.

4. An oscillator comprising:
   (a) means for producing an output signal having an output frequency, said producing means comprising:
      (i) an amplifier having an input and an output and a field effect transistor as an active element thereof;
      (ii) a resonator having a first port and a second port, used in a transmission mode as a feedback element in a feedback loop disposed between the input and the output of the amplifier;
      (iii) a voltage-controlled phase shifter having a control port, responsive to a control signal, for controlling the phase shift of signals fed thereto, and disposed in the feedback loop in series with the resonator;
      (iv) means for dividing signals from the feedback loop into at least a first path and a second path; and
      (v) a circulator having a first port, a second port and a third port, the first port of the circulator responsive to the signals in the first path, the second port of the circulator connected to the resonator; and
   (b) a discriminator circuit, using the resonator in the reflection mode, comprising:
      (i) a phase detector having a first and a second input port and an output port, the first input port responsive to signals from the third port of the circulator;
      (ii) a 90° phase shifter having an input port and an output port, the input port responsive to the signals from the second path and the output port connected to the second input port of the phase detector; and
      (iii) means, responsive to the output port of the phase detector, for providing the control signal to the voltage-controlled phase shifter; and
   (c) means for:
      (i) producing a resonator control signals for tuning the resonator at the output frequency;
      (ii) producing a 90° phase shifter control signal for tuning the 90° phase shifter; and
      (iii) producing a voltage-controlled phase shifter coarse control signal for tuning the voltage-controlled phase shifter to produce a selected differentiated phase shift corresponding to the output frequency.

5. A microwave oscillator having an output signal with an output frequency comprising:
   (a) an amplifier having a GaAs MESFET as an active element;
   (b) a resonator, resonant at the output frequency and comprising an yttrium-iron-garnet filter, connected to the amplifier and having a high Q to reduce FM noise and to provide positive feedback signals;

(c) a voltage-controlled phase shifter having an input port, an output port and a control port, the input port being fed by the amplifier and the output port coupled to the resonator;

(d) phase detector means, responsive to signals out of the voltage-controlled phase shifter shifted by 90° and a portion of the positive feedback signals, for providing signals representative of low frequency noise arising within the amplifier;

(d) means, responsive to the signals out of the phase detector means, for providing a control signal to the control port of the voltage-controlled phase shifter and for degenerating said low frequency noise; and (f) means for:
 (i) providing a resonator control signal for tuning the resonator at the output frequency;
 (ii) providing a 90° phase shifter control signal for tuning the phase shift to 90° of the signals fed to the phase detector means from the voltage-controlled phase shifter; and
 (iii) providing a voltage-controlled phase shifter coarse control signal for tuning the voltage-controlled phase shifter to produce a selected differentiated phase shift corresponding to the output frequency.

* * * * *